(12) United States Patent
Jeong et al.

(10) Patent No.: US 10,021,790 B2
(45) Date of Patent: Jul. 10, 2018

(54) MODULE WITH INTERNAL WIRE FENCE SHIELDING

(71) Applicant: Avago Technologies General IP (Singapore) Pte. Ltd., Singapore (SG)

(72) Inventors: Jin Jeong, Kyunggi province (KR); Chris Chung, En pyung Gu (KR); Nitesh Kumbhat, San Jose, CA (US); Ashish Alawani, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 200 days.

(21) Appl. No.: 15/054,208

(22) Filed: Feb. 26, 2016

(65) Prior Publication Data
US 2017/0251576 A1    Aug. 31, 2017

(51) Int. Cl.
| H05K 7/10 | (2006.01) |
| H05K 7/12 | (2006.01) |
| H05K 3/40 | (2006.01) |
| H05K 1/18 | (2006.01) |
| H05K 1/11 | (2006.01) |
| H05K 1/09 | (2006.01) |
| H05K 1/02 | (2006.01) |
| H05K 3/34 | (2006.01) |
| H05K 3/00 | (2006.01) |
| H05K 9/00 | (2006.01) |

(52) U.S. Cl.
CPC ......... *H05K 3/4038* (2013.01); *H05K 1/0271* (2013.01); *H05K 1/09* (2013.01); *H05K 1/111* (2013.01); *H05K 1/115* (2013.01); *H05K 1/181* (2013.01); *H05K 3/0047* (2013.01); *H05K 3/341* (2013.01); *H05K 9/0024* (2013.01); *H05K 2201/10287* (2013.01); *H05K 2201/10371* (2013.01); *H05K 2201/10977* (2013.01); *H05K 2203/0405* (2013.01); *H05K 2203/1316* (2013.01)

(58) Field of Classification Search
USPC .......................... 361/767, 808; 257/659, 422
See application file for complete search history.

(56) References Cited

U.S. PATENT DOCUMENTS

| 7,898,066 | B1 | 3/2011 | Scanlan et al. |
| 8,012,868 | B1 | 9/2011 | Naval et al. |
| 8,093,691 | B1 | 1/2012 | Fuentes et al. |
| 9,153,543 | B1 * | 10/2015 | Mangrum .............. H01L 23/60 |
| 2007/0163802 | A1 | 7/2007 | Monthei |
| 2011/0090651 | A1 * | 4/2011 | Jung .................... H03H 9/0514 361/748 |

* cited by examiner

*Primary Examiner* — Andargie M Aychillhum

(57) ABSTRACT

A module includes a PCB including a substrate, a component pad and at least one wire pad, an SMT component mounted to a component pad, a wire fence, a mold compound and a top conductive layer. Each wire pad is connected to ground by a corresponding via extending through the substrate, and the wire fence includes wire loops connected to each wire pad. The mold compound is disposed over the PCB, the SMT component and the wire fence, and defines multiple holes extending partially through the mold compound to top-edges of the wire loops, respectively, where a conductive material fills the holes. The top conductive layer is disposed over the mold compound, and is in electrical contact with the conductive material filling the holes. The wire fence, the conductive material, and the top conductive layer provide shielding of the SMT component from electromagnetic radiation.

13 Claims, 8 Drawing Sheets

MODULE WITH INTERNAL WIRE FENCE SHIELDING

BACKGROUND

Small electronic components, including amplifiers, filters, transducers and the like, are employed in a number of devices, particularly in radio frequency (RF) wireless communications, for example. Conventionally, the electronic components are combined in circuit packages and covered with external shields to form discrete shielded packages, referred to as "product modules" or "modules." Such module may be a full semiconductor chipset package including a printed circuit board (PCB) and one or more surface mount technology (SMT) components, such as the power amplifiers, filters and/or transducers. For wireless communications, for example, the SMT components may be molded together within an area of the module, typically having dimensions on the order of square millimeters, and work together at frequencies in gigahertz (GHz) ranges (e.g., 1.5 GHz and above). Over time and in response to demand, modules have been becoming smaller and/or incorporating multi-bands. Accordingly, the number of the interacting SMT components within a particular module may increase, while attempts are still being made to minimize the area of the module. This results in a higher chance of noise among the SMT components in close proximity, such as electromagnetic interference (EMI) caused by electromagnetic radiation emitted from the SMT components.

The external shields are generally shield layers that cover top and sidewalls of the modules, and provide protection against externally generated electromagnetic radiation ("external electromagnetic radiation"), as well as and environmental stress, such as temperature, humidity, and physical impact, for example. In order to provide protection against the external electromagnetic radiation, the external shields are formed of electrically conductive material, typically metal. The bottoms of the modules are typically not shielded by external shield layers, although the substrate, the ground layer, external connecting pins protruding from the PCB, and/or various electronic components, transmission lines and other circuitry within the PCB generally may provide some external shielding from external electromagnetic radiation. The external shield layers together with the bottom shielding together provide a "global shield" for the module.

One drawback of an external shield is that it provides no shielding of individual electronic components from internally generated electromagnetic radiation ("internal electromagnetic radiation") produced by other electronic components within the module, causing EMI, such as capacitive and inductive coupling and cross-talk. Indeed, the external shield, in some cases, may aggravate the EMI by reflecting the internal electromagnetic radiation back toward the electronic components within the module.

Various attempts to reduce internal noise within the module include internal EMI shielding, separating the SMT components. However, conventional internal shields may be ineffective and/or difficult and time-consuming to fabricate. Accordingly, what is needed is enhanced internal shielding and a more efficient process for fabricating internal shields, such as metal wire fences, in terms of process duration, cost, and less contact error between the wire or other metal forming the shields and the surface of the PCB, for example.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
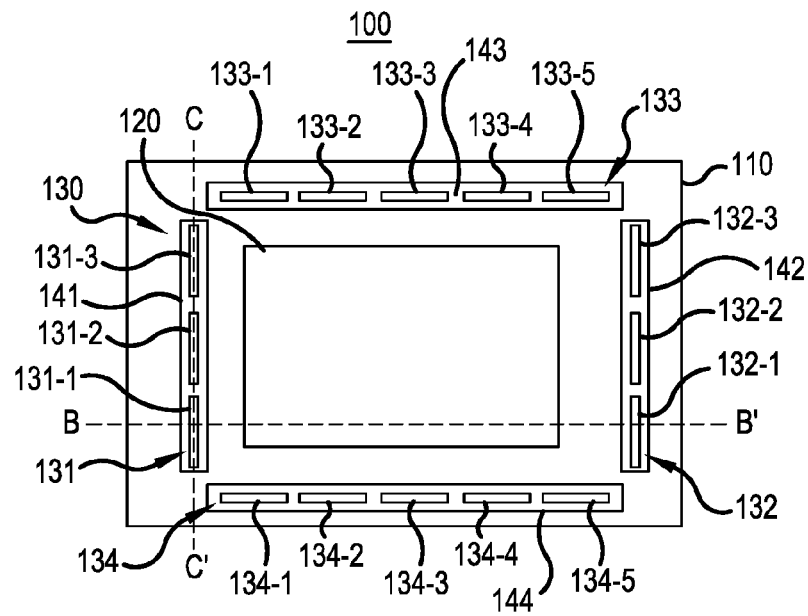
FIG. 1A is a simplified top plan view of a module including internal wire fence shielding, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" or "a component" includes one device and plural devices or components. The terms "substantial" or "substantially" mean to within acceptable limits or degree. The term "approximately" means to within an acceptable limit or amount to one of ordinary skill in the art. Relative terms, such as "above," "below," "top,"

"bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

In a representative embodiment, a module includes a printed circuit board (PCB) comprising a substrate, a ground layer, a component pad and at least one wire pad on a top surface of the PCB, each of the at least one wire pad being located adjacent the component pad and connected to the ground layer by a corresponding via extending through the substrate; a surface mount technology (SMT) component mounted to the component pad; a wire fence including multiple wire loops respectively connected to each of the at least one wire pad; a mold compound disposed over the PCB, the SMT component and the first wire fence, the mold compound defining multiple holes extending partially through the mold compound, from a top surface of the mold compound to top-edges of the multiple wire loops, respectively, where a conductive material fills the multiple holes; and a top conductive layer disposed over the top surface of the mold compound, and in electrical contact with the conductive material filling the holes. The wire fence, the conductive material filling the holes, and the top conductive layer provide shielding of the SMT component from electromagnetic radiation.

Figure 1B:
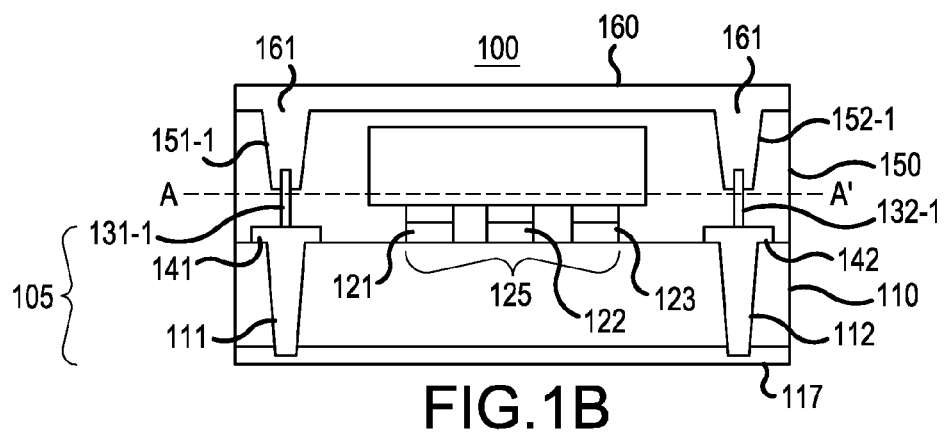
FIG. 1B is a simplified cross-sectional view of the module of FIG. 1A, according to a representative embodiment.
Figure 1C:
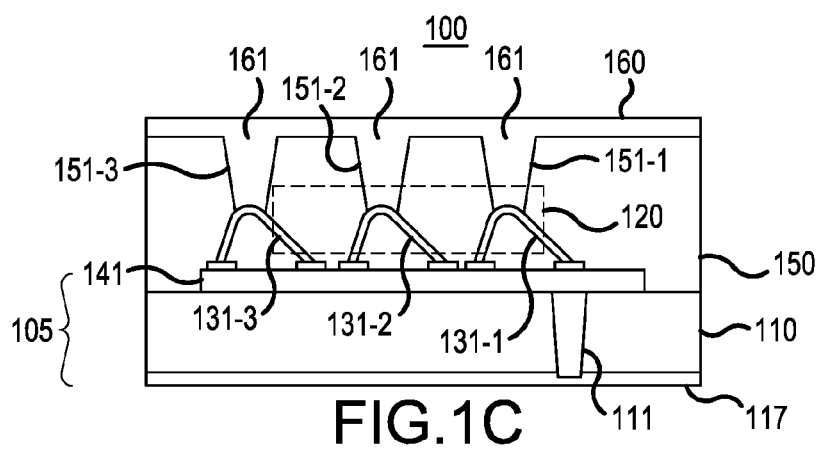
FIG. 1C is a simplified cross-sectional view of the module of FIG. 1A, according to a representative embodiment.
Figure 1D:
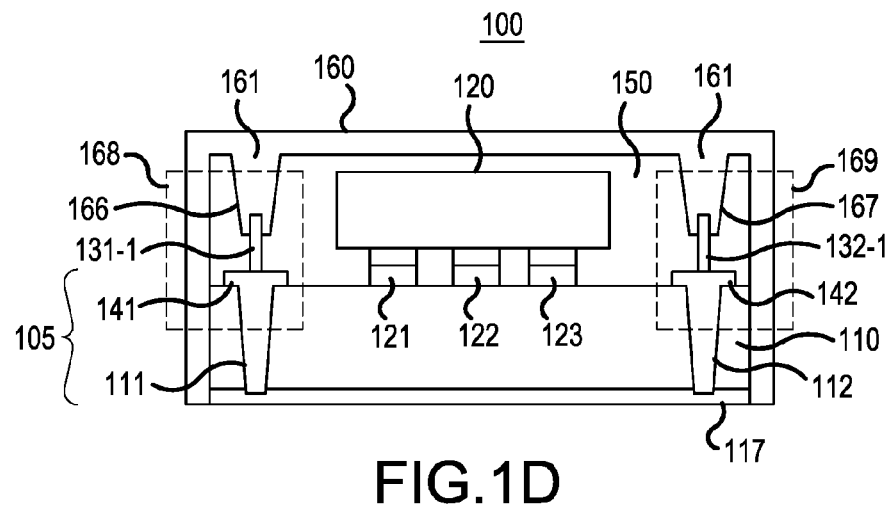
FIG. 1D is a simplified cross-sectional view of the module of FIG. 1A, according to a representative embodiment.

FIGS. 1A to 1D are diagrams of an illustrative module (or product module) 100, including shielding from EMI, between internal electronic components of the module and/or by external sources, through incorporation of at least one wire fence, which may be a metal wire fence, formed of multiple wire loops, according to a representative embodiment. FIG. 1A is a simplified top plan view of module 100, taken along dashed line A'-A' of the module 100 as shown in FIG. 1B. FIG. 1B is a simplified cross-sectional view of the module 100 taken along line B-B' of FIG. 1A, and FIG. 1C is a simplified cross-sectional view of the module 100 taken along line C-C' of FIG. 1A, according to a representative embodiment. FIG. 1D is a simplified cross-sectional view of module 100 taken along line A-A' of FIG. 1A, similar to the cross-sectional view shown FIG. 1B, with the addition of side conductive layers, according to a representative embodiment.

Referring to FIGS. 1A to 1C, the module 100 includes a printed circuit board (PCB) 105 comprising a ground layer 117, a substrate 110 (which may have embedded circuitry, and a patterned metal layer forming a set of component pads 125 and first through fourth wire pads 141 to 144. The substrate 110 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example.

The set of component pads 125 includes representative component pads 121, 122 and 123 arranged on the PCB 105, although it is understood that the set of component pads 125 may include various numbers and arrangements of component pads, depending on design and configuration requirements. The ground layer 117 is attached to the bottom (opposite) surface of the substrate 110, although in various configurations, all or a portion of the ground layer 117 may be embedded in the substrate 110. The set of component pads 125 and the ground layer 117 may be formed of any conductive material compatible with semiconductor processes, such as gold (Au), silver (Ag), aluminum (Al) or copper (Cu), for example. An illustrative surface mount technology (SMT) component 120 is mounted to the set of component pads 125. Examples of the SMT component 120 include power amplifiers, filters, transducers, wirebond dies, complementary metal-oxide semiconductor (CMOS) circuits, integrated silicon-on-insulator (SOI) circuits and the like, although the various embodiments are not limited to these examples.

A wire fence 130 is also mounted to the PCB 105 via the first through fourth wire pads 141 to 144, substantially surrounding the SMT component 120. In the depicted embodiment, the wire fence 130 comprises a first wire fence portion 131 attached to the first wire pad 141, a second wire fence portion 132 attached to the second wire pad 142, a third wire fence portion 133 attached to the third wire pad 143, and a fourth wire fence portion 134 attached to the fourth wire pad 144. The first through fourth wire pads 141 to 144 (and thus the corresponding first through fourth wire fence portions 131 to 134) are located adjacent the four sides of the SMT component 120 (and corresponding sides of the set of component pads 125), respectively.

The wire fence 130 is formed by multiple wire loops of the first to fourth wire fence portions 131 to 134, respectively, attached to the first through fourth wire pads 141 to 144. In the depicted embodiment, each of the first and second wire fence portions 131 and 132 is formed by three wire loops aligned end-to-end. That is, the first wire fence portion 131 comprises wire loops 131-1, 131-2 and 131-3, each of which has both ends attached to the first wire pad 141, and the second wire fence portion 132 comprises wire loops 132-1, 132-2 and 132-3, each of which has both ends attached to the second wire pad 142. Similarly, in the depicted embodiment, each of the third and fourth wire fence portions 133 and 134 is formed by five wire loops aligned end-to-end. That is, the third wire fence portion 133 comprises wire loops 133-1, 133-2, 133-3, 133-4 and 133-5, each of which has both ends attached to the third wire pad 143, and the fourth wire fence portion 134 comprises wire loops 134-1, 134-2, 134-3, 134-4 and 134-5, each of which has both ends attached to the fourth wire pad 144. The wire loops 131-1 to 131-3, 132-1 to 132-3, 133-1 to 132-5 and 134-1 to 134-5 may be formed of gold (Au), silver (Ag), aluminum (Al) or copper (Cu), for example.

As mentioned above, each of the component pads 121 to 123, and each of the first through fourth wire pads 141 to 144 is formed from a pattern metal layer on a top surface of the substrate 110, and the ground layer 117 is attached to the bottom (opposite) surface of the substrate 110. The SMT component 120 may be electrically and/or mechanically attached to the set of component pads 125 by any compatible attachment technique, such as soldering. The first wire pad 141, and thus the first wire fence portion 131, is connected to the ground layer 117 by way of a via 111 through the substrate 110. The second wire pad 142, and thus the second wire fence portion 132, is connected to the ground layer 117 by way of via 112. The vias 111 and 112 may be electroplated with electrically conductive material (e.g., copper (Cu)) to provide the electrical connections between the first and second wire fence portions 131 and 132 and the ground layer 117, respectively. Although not shown, each of the third and fourth wire fence portions 133 and 134 are likewise electrically connected the ground layer 117, e.g., through corresponding vias (not shown) in the substrate 110.

It is understood, though, that each of the first to fourth wire fence portions 131 to 134 may be grounded in a manner other than connection to the ground layer 117, and that one or more of the first to fourth wire fence portions 131 to 134 may be grounded separately from the others, without departing from the scope of the present teachings. It is further understood that, in alternative embodiments, one or more of the wire loops in a wire fence portions 131 to 134 may have its corresponding ends connected to a separate (grounded) wire pad (not shown), dedicated to that wire loop, as opposed to all of the wire loops in a wire fence portion 131 to 134 having corresponding ends connected to the same wire pad, as shown in the embodiment of FIGS. 1A to 1C. Of course, alternative arrangements of pads, vias, ground layers and other electrical circuitry may be included in or on the PCB 105, to provide unique benefits for any particular situation or to meet application specific design requirements of various implementations, without departing from the scope of the present teachings.

A mold compound 150 is disposed over the top surface of the PCB 105, the SMT component 120, and the wire fence 130 (and thus the first to fourth wire fence portions 131 to 134). The mold compound 150 may be formed of a reinforced or non-reinforced epoxy resin, for example, generally protecting the SMT component 120 and providing additional structural support to the module 100. In various embodiments, the mold compound 150 may hermetically seal the SMT component 120 within the module 100.

In the depicted embodiment, the mold compound 150 defines multiple holes corresponding to the multiple wire loops 131-1 to 131-3, 132-1 to 132-3, 133-1 to 133-5 and 134-1 to 134-5, respectively. The holes, which are filled with electrically conductive material, extend partially through the mold compound 150 to the corresponding wire loops 131-1 to 131-3, 132-1 to 132-3, 133-1 to 133-5, and 134-1 to 134-5, respectively. This enables electrical contact between a top conductive layer 160 disposed over a top surface of the mold compound 150 and each of the wire loops 131-1 to 131-3, 132-1 to 132-3, 133-1 to 133-5, and 134-1 to 134-5. For example, as shown in FIG. 1B, holes 151-1 and 152-1 extend partially through the mold compound 150, from the top surface of the mold compound 150 to top-edges of the corresponding wire loops 131-1 and 132-1. Likewise, as shown in FIG. 1C, holes 151-1, 151-2 and 151-3 extend partially through the mold compound 150, from the top surface of the mold compound 150 to the top-edges of the corresponding wire loops 131-1, 131-2 and 131-3.

In the depicted embodiment, each of the wire loops (e.g., the wire loops 131-1, 131-2 and 131-3 in FIG. 1C) is generally shaped like an inverted "U" or "V," such that each of the wire loops has an apex (or top-edge) that is in contact with the conductive material 161 filling each of the holes, and includes two ends in contact with the corresponding wire pad (e.g., the first wire pad 141 in FIG. 1C). The conductive material 161 filling each of the holes in the mold compound 150 may be formed of the same material as the top conductive layer 160, such as copper (Cu) or silver (Ag), for example. In the depicted embodiment, the wire fence 130, the conductive material 161 filling the multiple holes (e.g., holes 151-1 to 151-3), and the top conductive layer 160, individually and collectively, provide shielding of the SMT component 120 from electromagnetic radiation, generated internally to the module 100 (e.g., by other SMT components) and externally from the module 100 (e.g., by other modules, power sources, and the like). The wire fence 130 and the conductive material 161 generally provide lateral shielding.

Referring to FIG. 1D, side conductive layers 166 and 167 are disposed over side surfaces of the mold compound 150 and the PCB 105. The side conductive layers 166 and 167 are electrically grounded. For example, each of the side conductive layers 166 and 167 are in electrical contact with the top conductive layer 160 and the ground layer 117 (which may also electrically ground the top conductive layer 160). Alternatively, one or both of the side conductive layers 166 and 167 may be electrically grounded through the top conductive layer 160, the conductive material 161, the wire fence 130 and one or more of the vias (e.g., vias 111 and 112). Notably, the side conductive layers 166 and 167 form double lateral side shields for further providing additional electromagnetic shielding from electromagnetic radiation generated externally from the module 100, as shown in dashed boxes 168 and 169, respectively. The top conductive layer 160 and/or the side conductive layers 166 and 167 may also provide protection of the SMT component 120 from various environmental stresses, such as temperature, moisture and physical impact.

Although FIGS. 1A to 1D show a module 100 having a single SMT component 120, it is understood that a module may contain multiple SMT components, all or some of which are at least partially surrounded by corresponding wire fences, without departing from the scope of the present teachings. Likewise, in alternative embodiments, multiple SMT components may be located within a perimeter of a single wire fence.

Figure 2:
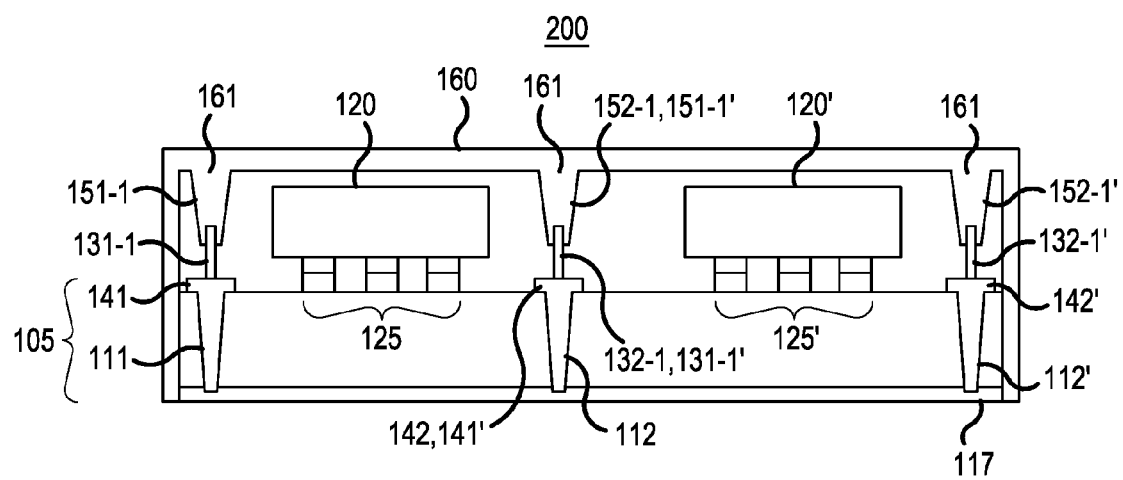
FIG. 2 is a simplified cross-sectional view of a module including internal wire fence shielding of multiple surface mount technology (SMT) components, according to a representative embodiment.

For example, FIG. 2 is a cross-sectional view of a module 200 that is substantially the same as the module 100, except that the module 200 includes multiple SMT components 120 and 120' surrounded by corresponding wire fences 130 and 130' for electromagnetic shielding, respectively, according to a representative embodiment. For simplicity of explanation, it is understood that the elements of FIGS. 1A to 1D are likewise included in the module 200 of FIG. 2, and that additional elements, e.g., related to the configuration of the wire fence 130' and electromagnetic shielding of the SMT component 120', are present and substantially the same as the corresponding elements described above. Therefore, only those elements actually shown in FIG. 2 will be described, although it is understood that the other elements related to the configuration of the wire fence 130 and the electromagnetic shield of the SMT component 120 are present with respect to the configuration of the wire fence 130' and the electromagnetic shield of the SMT component 120', as would be apparent to one skilled in the art.

Referring to FIG. 2, the module 200 includes the PCB 105, and multiple illustrative SMT components 120 and 120' mounted to the PCB 105 via sets of component pads 125 and 125', respectively. Wire fences 130 and 130' are also mounted to the PCB 105, each on first through fourth wire pads (where the wire pad between the SMT components 120 and 120' is shared, such that the second wire pad 142 of the wire fence 130 doubles as the first wire pad 141' of the wire fence 130'). In the depicted cross-sectional view, only first wire pad 141 and second wire pad 142 of the wire fence 130, and first wire pad 141' and second wire pad 142' of the wire fence 130' are shown (where the second wire pad 142 and the first wire pad 141' are the same wire pad, as mentioned above). In alternative configurations, which do not involve sharing portions of the adjacent wire fences, separate wire pads may be incorporated as the second wire pad 142 and the first wire pad 141', respectively, without departing from the scope of the present teachings.

In the depicted embodiment, the wire fence 130 comprises a first wire fence portion 131 attached to the first wire pad 141, a second wire fence portion 132 attached to the second wire pad 142, and third and fourth wire fence portions (not shown in FIG. 2). The wire fence 130' comprises a first wire fence portion 131' attached to the first wire pad 141', a second wire fence portion 132' attached to the second wire pad 142', and third and fourth wire fence portions (not shown in FIG. 2). The wire fences 130, 130' are formed collectively by multiple wire loops of the first to fourth wire fence portions attached to the first through fourth wire pads, respectively.

Mold compound 150 is disposed over the top of the PCB 105, the SMT components 120 and 120', and the wire fences 130 and 130'. The mold compound 150 defines multiple holes corresponding to the multiple wire loops (e.g., wire loops 131-1, 132-1, 131-1' and 132-1', where 132-1 and 131-1' represent same wire loop shared by the wire fences 130 and 130'), respectively. The holes are filled with the electrically conductive material 161, and extend partially through the mold compound 150 to the corresponding wire loops (e.g., wire loops 131-1, 132-1, 131-1', and 132-1'), respectively. This enables electrical contact between the top conductive layer 160 disposed over the top surface of the mold compound 150 and each of the wire loops. For example, as shown in FIG. 2, holes 151-1, 152-1, 151-1' and 152-1', where 152-1 and 151-1' represent same hole, extend partially through the mold compound 150, from the top surface of the mold compound 150 to top-edges of the corresponding wire loops 131-1, 132-1, 131-1' and 132-1'. In the depicted embodiment, the wire fence 130, the conductive material 161 filling the multiple holes (e.g., holes 151-1, 152-1), and the top conductive layer 160 provide shielding of the SMT component 120 from electromagnetic radiation, and the wire fence 130', the conductive material 161 filling the multiple holes (e.g., holes 151-1', 152-1'), and the top conductive layer 160 provide shielding of the SMT component 120' from electromagnetic radiation.

FIGS. 3A to 3E are simplified cross-sectional views showing an illustrative method of fabricating a module with internal wire fence shielding, according to a representative embodiment.

Figure 3A:
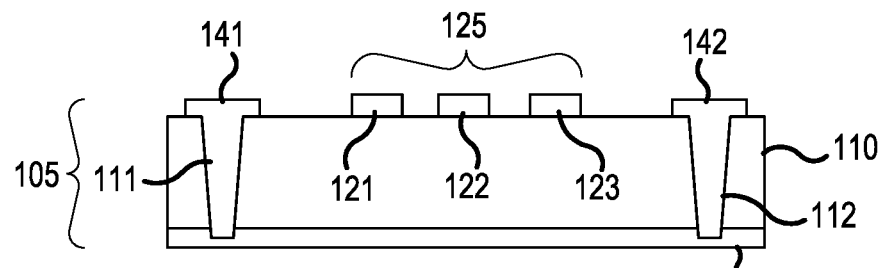
FIGS. 3A to 3E are simplified cross-sectional views showing an illustrative method of fabricating a module with internal wire fence shielding, according to a representative embodiment.

Referring to FIG. 3A, a base PCB 105 and electrical circuitry are provided. That is, the PCB 105 comprises ground layer 117, substrate 110, and a patterned metal layer providing a set of component pads 125 and first and second wire pads 141 and 142. Vias 111 and 112 are formed through the substrate 110 by any compatible via formation method, such as wet etching openings through the substrate 110, followed by electromagnetic plating metal to the sides of the openings with copper (Cu) plating, for example, and/or filling the openings with a first conductive material, to form the vias 111 and 112. The metal may be copper (Cu), for example. The first and second wire pads 141 and 142 (along with other wire pads, not shown) and the set of component pads 125 (e.g., including component pads 121, 122 and 123) are formed on a top surface of the substrate 110. The first and second wire pads 141 and 142, and the set of component pads 125 of the patterned metal layer may be formed, for example, by applying a metal layer, such as copper (Cu), to the top surface of the substrate 110 using a sputtering process or a chemical vapor deposition (CVD) process. The metal layer may then be patterned, e.g., using an etch mask, to provide desired shapes and locations of the first and second wire pads 141 and 142, and the set of component pads 125. Of course other methods of forming the patterned metal layer may be incorporated without departing from the scope of the present teachings. In the depicted embodiment, the first and second wire pads 141 and 142 are connected to the ground layer 117 by the vias 111 and 112, respectively, thereby grounding the first and second wire pads 141 and 142.

Figure 3B:
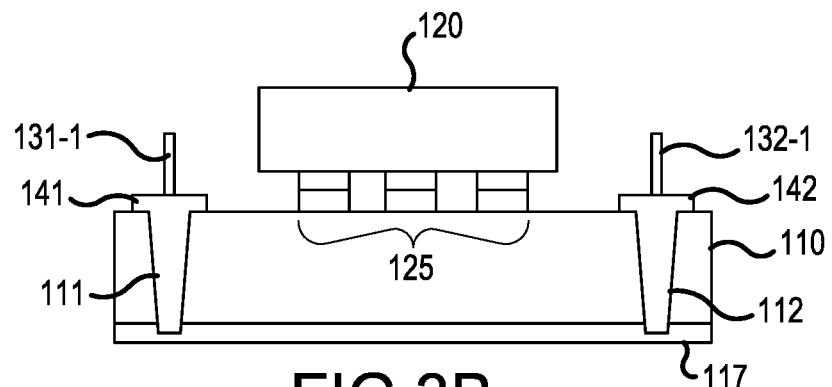

Referring to FIG. 3B, an SMT component 120 is attached to the component pads 121, 122 and 123 of the set of component pads 125. The SMT component 120 may be attached using any compatible attachment method, such as placing the SMT component 120 on solder balls applied to the component pads 121, 122 and 123, and reflowing the solder. In addition, wire loops are attached to corresponding wire pads, as indicated by illustrative wire loops 131-1 and 132-1 attached to wire pads 141 and 142, respectively. As mentioned above, each of the wire loops is generally shaped like an inverted "U" or "V," with two ends attached to the same wire pad and an apex extending away from the wire pad, as shown by illustrative wire loops 131-1, 131-2 and 131-3 attached to the wire pad 141 in FIG. 4, for example. The wire loops 131-1 and 132-1 may be attached using any compatible attachment method, such as placing the wire loops 131-1 and 132-1 on solder balls applied to the wire pad 141 or 142, and reflowing the solder. The other wire loops (e.g., wire loops 131-2 and 131-3, wire loops 132-2 and 132-3, wire loops 133-1, 133-2, 133-3, 133-4 and 133-5, and wire loops 134-1, 134-2, 134-3, 134-4 and 134-5) may be formed in substantially the same manner.

Figure 4:
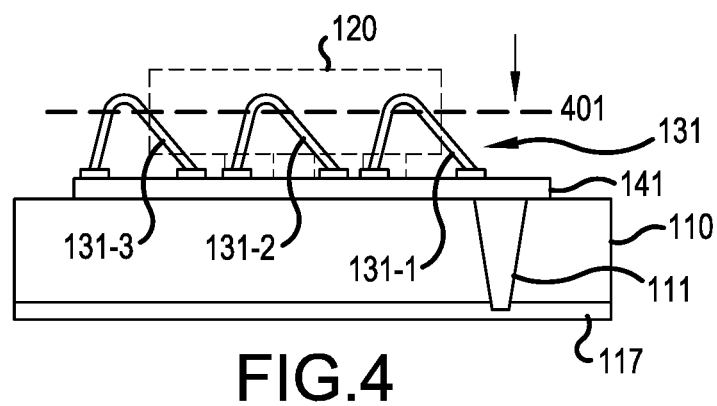
FIG. 4 is a simplified cross-sectional view showing an operation in the illustrative method of fabricating a module with internal wire fence shielding, according to a representative embodiment.

The wire loops are aligned end-to-end, as shown by wire loops 131-1 to 131-3 in FIG. 4, and as discussed above, to form a wire fence (e.g., wire fence 130) or at least a wire fence portion of the wire fence (e.g., first wire fence portion 131) adjacent the SMT component 120. Further, because the wire loops, such as the wire loops 131-1 to 131-3 in FIG. 4, of the wire fence are formed before application of the mold compound 150, they may be more accurately formed in desired shapes, like the inverted "U" or "V" shapes shown in FIG. 4, and also formed more uniformly with respect to shapes of the other wire loops. In comparison, conventional methods involve attaching wire loops after the mold compound 150 has been applied and holes drilled down to the wire pads, as discussed below, making attachment and shaping of the wire loops more difficult, less precise and less uniform.

Figure 3C:
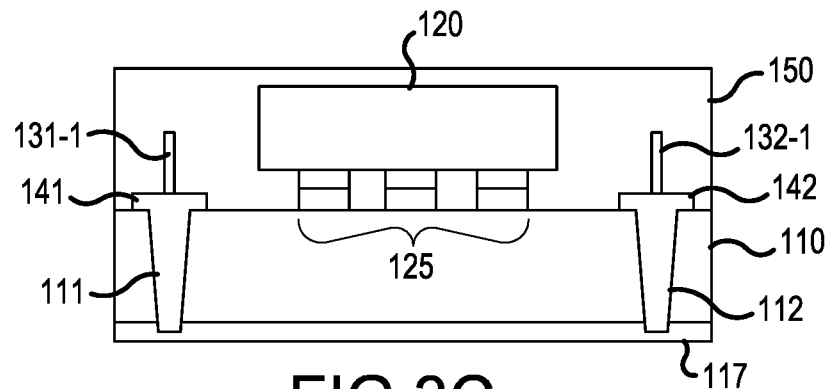

As shown in FIG. 3C mold compound 150 is disposed over the top of the PCB 105, the SMT component 120 and the wire fence 130. In an embodiment, disposing the mold compound 150 over the top of the PCB 105, the SMT component 120 and the wire fence 130 may include an injection molding process, a transfer molding process, or a compression molding process, for example, although other methods of disposing the mold compound 150 may be used without departing from the scope of the present teachings. For example, the mold compound 150 may be formed of an epoxy resin, which is applied in a liquid or viscous state, and then allowed to set to provide the solid mold compound 150.

Figure 3D:
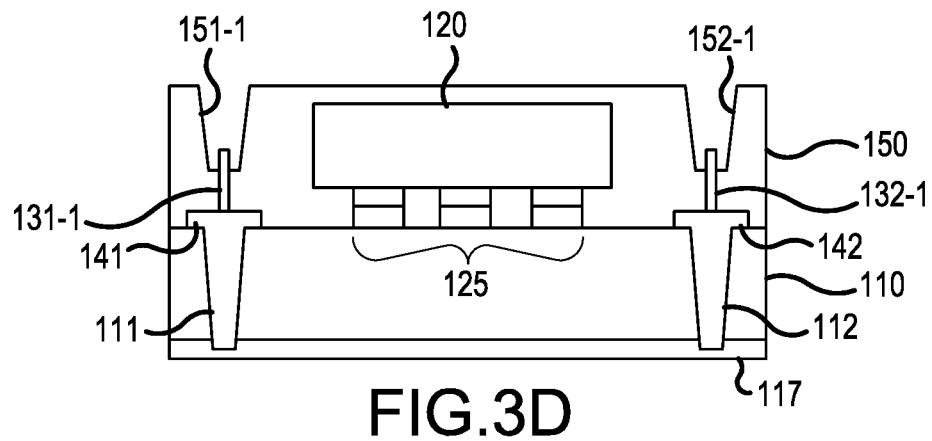

Referring to FIG. 3D, multiple holes, such as illustrative holes 151-1 and 152-1, are formed in the mold compound 150. Each hole extends partially through the mold compound 150, from a top surface of the mold compound 150 to the top-edges of the wire loops, as shown by the holes 151-1 and 152-1 exposing the top-edges (or apexes) of the wire loops 131-1 and 132-1 in the bottom of the holes, respectively. FIG. 4 shows an example of the depth of the holes, which extend from the top surface of the mold compound 150 to dashed line 401, thereby exposing the top-edges (shown above the dashed line 401) of the wire loops 131-1, 131-2 and 131-3. In an embodiment, the holes are formed in the mold compound 150 by laser drilling through the mold compound 150 until the top-edge of one of the wire loops is exposed, using a laser, such as a yttrium aluminum garnet (YAG) laser or a helium gas laser, for example. Alternatively, mechanical drilling or other mechanical process may be incorporated, without departing from the scope of the present teachings.

Figure 3E:
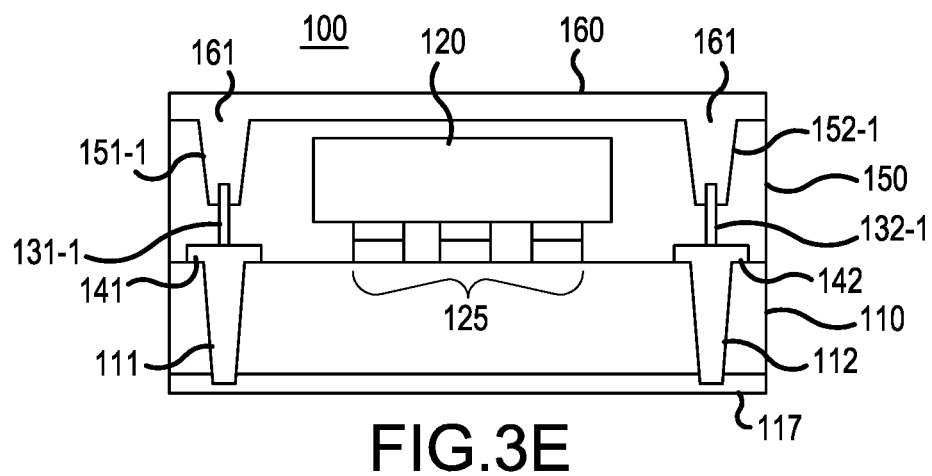

As shown in FIG. 3E, the holes in mold compound 150, including the illustrative holes 151-1 and 152-1, are filled with conductive material 161, such as copper (Cu) or silver (Ag), for example. The top conductive layer 160 is disposed over the top surface of the mold compound 150 and the multiple holes (e.g., holes 151-1 and 152-1) filled with the conductive material 161. The top conductive layer 160 may be applied using a sputtering process or a chemical vapor deposition (CVD) process, for example, and likewise may be formed of copper (Cu) or silver (Ag), for example. In an embodiment, filling the holes with the conductive material 161 and applying the top conductive layer 160 may be performed in the same operation. The top conductive layer 160 is thus in electrical contact with the conductive material 161 filling the holes, as well as the wire loops (e.g., wire loops 131-1 and 132-1). Thus, in FIG. 3E (which is the same as FIG. 1B, showing the finished module 100, discussed above), the wire fence 130 (e.g., including wire loops 131-1 and 132-1), the conductive material 161 filling the multiple holes (e.g., including holes 151-1 and 152-1, and the top conductive layer 160 provide shielding of the SMT component 120 from electromagnetic radiation. In addition, side conductive layers 166 and 167 may then be disposed over the side surfaces of the mold compound 150 and the PCB 105. The side conductive layers 166 and 167 may be disposed using a sputtering process, for example.

The method described above with reference to FIGS. 3A to 4 is more efficient than conventional fabrication methods. For example, conventional methods generally apply a compound mold to the PCB before attaching the wire loops forming a wire fence. Then, larger holes are drilled through the entirety of the compound mold to wire pads of the PCB, which requires significantly more drilling and subsequent clean-up, e.g., of the wire pad surface so that it is able to safely accommodate wire loop attachment. Otherwise, residual mold compound from the incomplete drill may result in contact error between the wire loop and the wire pad. The cleaning process increases the time for fabrication, in part because the drilled area is very small and thus requires very fine treatment. Even so, the chances of physical damage to the hole or the PCB are higher. In addition, because the holes in the present embodiment are shorter (extending only to the top-edges of the wire loops as opposed to the wire pads on the PCB), a narrower laser drill may be used. This enables closer placement of the wire loops, and thus denser wire fences. The denser wire fences, in turn, enable closer placement of SMT components on the PCB, reducing overall area or enable more SMT components to be mounted within the same area.

Figure 5A:
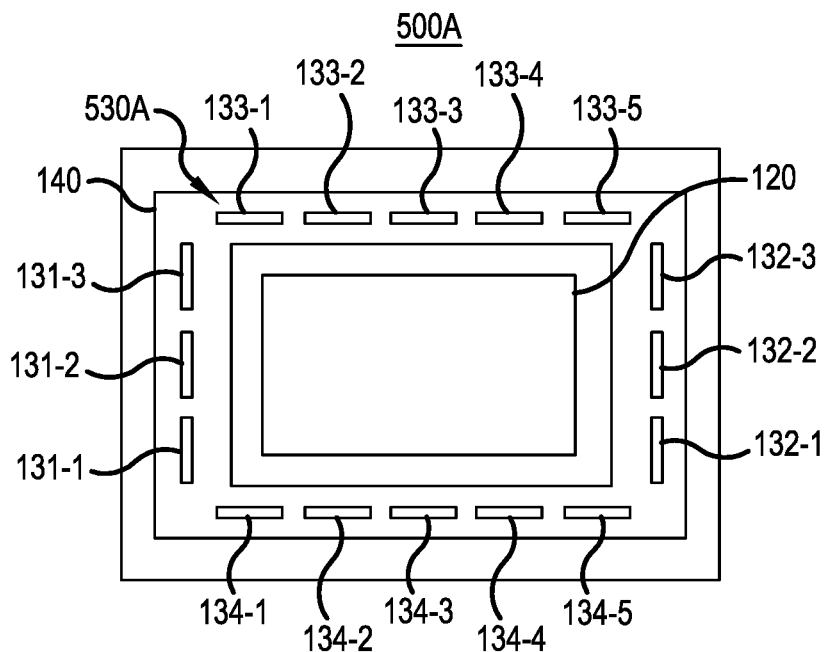
FIGS. 5A to 5C are simplified top plan views of module including different configurations of internal wire fence shielding, according to representative embodiments.
Figure 5B:
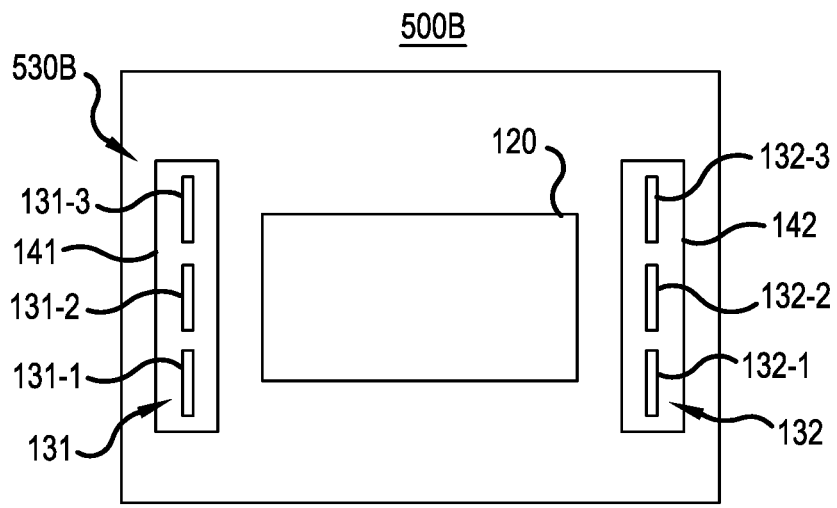
Figure 5C:
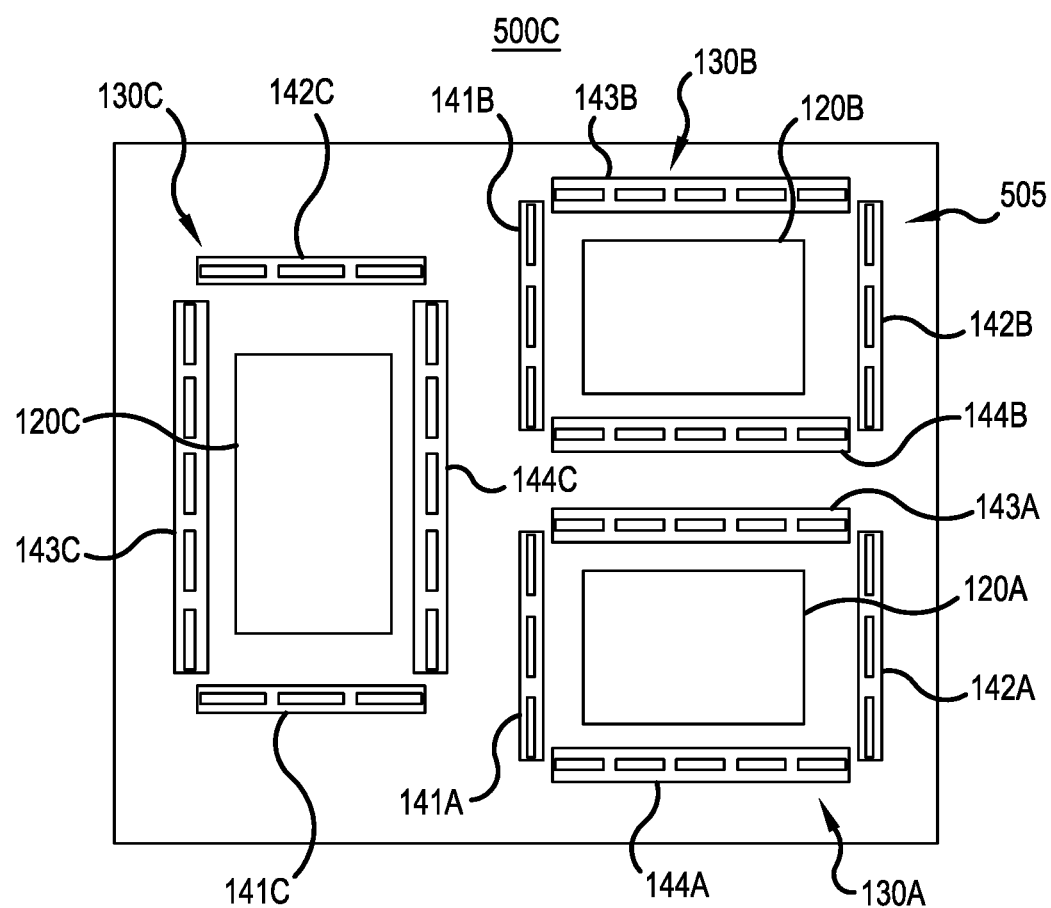

FIGS. 5A to 5C are simplified top plan views of module including different configurations of internal wire fence shielding, according to representative embodiments.

Referring to FIG. 5A, the SMT component 120 of module 500A is surrounded by a wire fence 530A mounted on a single, continuous wire pad 140 that surrounds an outer perimeter of the SMT component 120 (as well as the component pads, e.g., illustrative component pads 121, 122 and 123, to which the SMT component 120 is attached). More particularly, the wire pad 140 resembles a frame in that it includes an open center portion that accommodates placement of the component pads 121, 122 and 123 and the SMT component 120. Accordingly, the wire loops 131-1, 131-2 and 131-3, the wire loops 132-1, 132-2 and 132-3, the wire loops 133-1, 133-2, 133-3, 133-4 and 133-5, and the wire loops 134-1, 134-2, 134-3, 134-4 and 134-5) are all attached to the single continuous wire pad 140 to form the wire fence 530A. Notably, although each of the wire pad 140 and the wire fence 530A attached thereto are shown as having a rectangular shape, it is understood that the wire pad 140 and the wire fence 530A (as well as any other wire pads, component pads and/or wire fences discussed in this disclosure) may have any shape, such as a square, a trapezoid, a circle, or an oval, for example, to provide unique benefits for any particular situation or to meet application specific design requirements of various implementations, without departing from the scope of the present teachings.

As mentioned above, according to various embodiments, the wire fence may only partially surround the SMT component 120. That is, the wire fence may be attached adjacent to fewer than all sides of the SMT component 120 (as well as the component pads, e.g., illustrative component pads 121, 122 and 123 to which the SMT component 120 is attached). For example, referring to FIG. 5B, module 500B includes a wire fence 530B arranged on only two sides of the SMT component 120 and the illustrative component pads 121, 122 and 123. Thus, the wire fence 530B includes first wire fence portion 131 attached to first wire pad 141, and second wire fence portion 132 attached to second wire pad 142. In the depicted embodiment, the first and second wire fence portions 131 and 132 (as well as the first and second wire pads 141 and 142) are located adjacent opposite sides of the SMT component 120 (and of the component pads 121, 122 and 123), respectively. Accordingly, the wire loops 131-1, 131-2 and 131-3 of the first wire fence portion 131 are attached to the first wire pad 141, and the wire loops 132-1, 132-2 and 132-3 of the second wire fence portion 132 are attached to the second wire pad 142 to form the wire fence 530B.

Notably, although the wire fence 530B is shown as two fence portions (first and second wire fence portions 131 and 132) located adjacent opposite sides of the SMT component 120, it is understood that a wire fence that only partially surrounds the SMT component 120 may include any combination of fewer than all wire fence portions, to provide unique benefits for any particular situation or to meet application specific design requirements of various implementations, without departing from the scope of the present teachings. For example, the wire fence that provides shielding for the SMT component 120 may include third and fourth wire fence portions 133 and 134, first and third wire fence portions 131 and 133, first and fourth wire fence portions 131 and 134, second and third wire fence portions 132 and 133, or first and third wire fence portions 131 and 133. Likewise, the wire fence may include only one wire fence portion arranged adjacent to one side of the SMT component 120, or any combination of three wire fence portions, to provide shielding for the SMT component 120, without departing from the scope of the present teachings.

FIG. 5C depicts an example of a module that includes multiple SMT components, protected from electromagnetic radiation by corresponding wire fences. In the depicted example, module 500C includes three SMT components, first SMT component 120A, second SMT component 120B and third SMT component 120C, all mounted on the same PCB (e.g., PCB 505). The first SMT component 120A is surrounded by wire fence 130A; the second SMT component 120B is surrounded by wire fence 130B; and the third SMT component 120C is surrounded by wire fence 130C. Each of the wire fences 130A, 130B and 130C is substantially similar to the wire fence 130 discussed above with reference to FIGS. 1A to 1D, and therefore detailed description will not be repeated. Generally, though, the wire loops of the wire fence 130A are respectively attached to first through fourth wire pads 141A to 144A arranged around the SMT component 120A; the wire loops of the wire fence 130B are respectively attached to first through fourth wire pads 141B to 144B arranged around the SMT component 120B; and the wire loops of the wire fence 130C are respectively attached to first through fourth wire pads 141C to 144C arranged around the SMT component 120C.

Of course, the numbers of SMT components and the arrangements of corresponding wire fences (e.g., surrounding versus partially surrounding wire fences, as discussed above) may vary to provide unique benefits for any particular situation or to meet application specific design requirements of various implementations, without departing from the scope of the present teachings. Additionally, in alternative embodiments, one or more of the SMT components may not have a corresponding wire fence. Rather, that SMT component may have no internal electromagnetic shielding, or may have some other type of electromagnetic shielding.

In alternative embodiments, multiple rows of wire loops may be provided adjacent to one another to form multiple wire fences and/or multiple wire fence portions arranged in parallel. For example, a first wire fence (or wire fence portion) comprising multiple wire loops aligned end-to-end may be formed on a wire pad, and a second wire fence (or wire fence portion) comprising multiple wire loops aligned end-to-end may be formed on the same wire pad substantially in parallel with the first wire fence (or wire fence portion). An example of this arrangement is shown in FIGS. 6A to 6E, which are simplified cross-sectional views showing an illustrative method of fabricating a module with parallel internal wire fences, according to a representative embodiment.

As an initial matter, a base PCB and electrical circuitry are provided as shown in FIG. 3A, for example. That is, PCB 105 comprises ground layer 117, substrate 110, and a patterned metal layer providing a set of component pads 125 and first and second wire pads 141 and 142. Vias 111 and 112 are formed through the PCB 105 by any compatible via formation method. First and second wire pads 141 and 142 (along with other wire pads, not shown) and a set of component pads 125 (e.g., including component pads 121, 122 and 123) are formed on the top surface of the substrate 110. The first and second wire pads 141 and 142 are thus connected to the ground layer 117 by the vias 111 and 112, respectively, grounding the first and second wire pads 141 and 142.

Figure 6A:
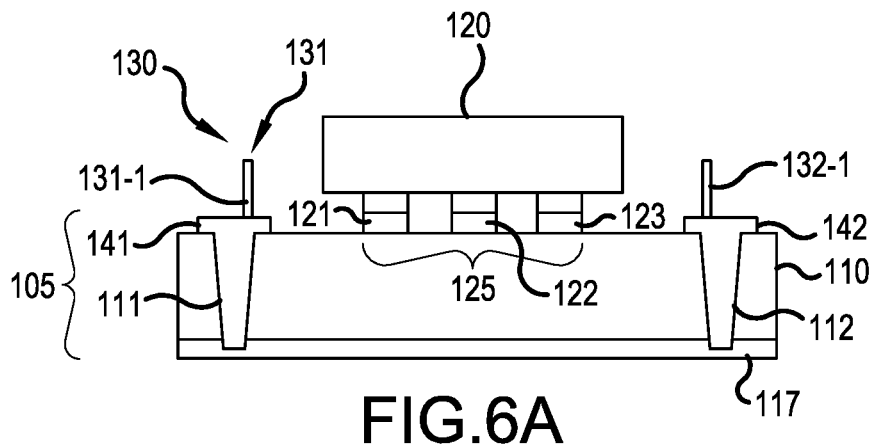
FIGS. 6A to 6E are simplified cross-sectional views showing an illustrative method of fabricating a module with multiple internal wire fence shields, according to a representative embodiment.
Figure 7:
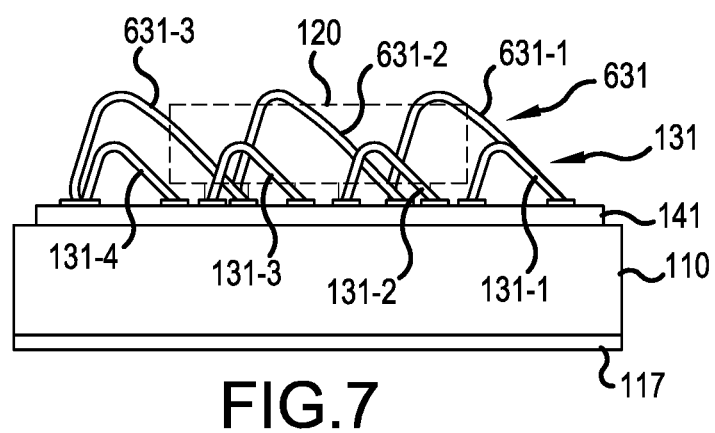
FIG. 7 is a simplified cross-sectional view showing an operation in the illustrative method of fabricating a module with multiple internal wire fence shields, according to a representative embodiment.

Referring to FIG. 6A, an SMT component 120 is attached to the component pads 121, 122 and 123 of the set of component pads 125. The SMT component 120 may be attached using any compatible attachment method, such as placing the SMT component 120 on solder balls applied to the component pads 121, 122 and 123, and reflowing the solder. In addition, first or inner wire loops are attached to corresponding wire pads, as indicated by illustrative inner wire loops 131-1 and 132-1 attached to wire pads 141 and 142, respectively, to form at least a portion of an inner wire fence 130. As mentioned above, each of the inner wire loops is generally shaped like an inverted "U" or "V," with two ends attached to the same wire pad and an apex extending away from the wire pad, as shown by illustrative inner wire loops 131-1, 131-2, 131-3 and 131-4 attached to the wire pad 141 in FIG. 7, for example. The inner wire loops 131-1 and 132-1 may be attached using any compatible attachment method, such as placing the inner wire loops 131-1 and 132-1 on solder balls applied to the wire pads 141 or 142, and reflowing the solder. Other inner wire loops (not shown) of an inner wire fence 130 are formed in substantially the same manner. The inner wire loops are aligned end-to-end, as shown by inner wire loops 131-1 to 131-4 in FIG. 7 to form the inner wire fence 130 or at least a fence portion (e.g., first wire fence portion 131) of the inner wire fence 130 located adjacent the SMT component 120.

Figure 6B:
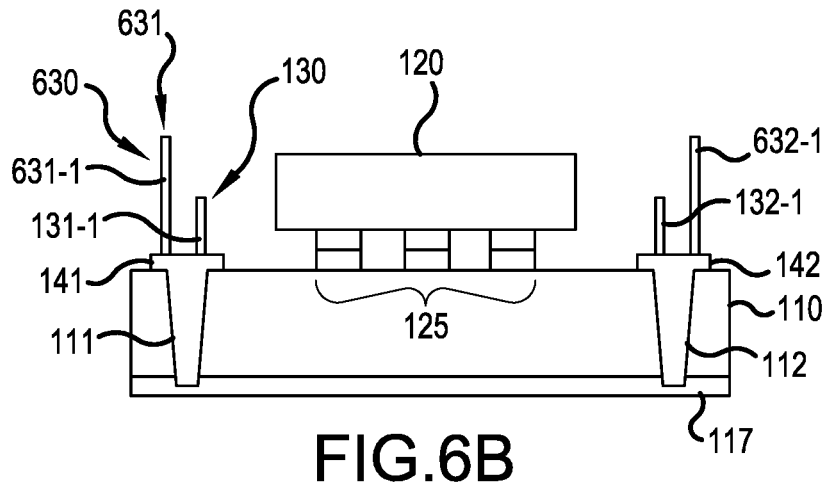

Referring to FIG. 6B, second or outer wire loops are attached to corresponding wire pads, as indicated by illustrative outer wire loops 631-1 and 632-1, also attached to wire pads 141 and 142, respectively, to form at least a portion of an outer wire fence 630. As mentioned above, each of the outer wire loops is generally shaped like an inverted "U" or "V," with two ends attached to the same wire pad and an apex extending away from the wire pad, as shown by illustrative outer wire loops 631-1, 631-2 and 631-3 attached to the wire pad 141 in FIG. 7, for example. The outer wire loops 631-1 and 632-1 may be attached using any compatible attachment method, such as placing the outer wire loops 631-1 and 632-1 on solder balls applied to the wire pad 141 or 142, and reflowing the solder. Other outer wire loops (not shown) of the outer wire fence 630 are formed in substantially the same manner. The wire loops are aligned end-to-end, as shown by outer wire loops 631-1, 631-2 and 631-3 in FIG. 7 to form the outer wire fence 630, or at least a fence portion (e.g., first outer wire fence portion 631) of the outer wire fence 630 located adjacent the inner wire fence 130.

In the depicted embodiment, the top-edges of the outer wire loops, as shown by illustrative outer wire loops 631-1 and 632-1, respectively, are higher than the top-edges of the inner wire loops, as shown by illustrative inner wire loops 131-1 and 132-1, such that the wire loop portion of the outer wire fence 630 is taller than the wire loop portion of the inner wire fence 130. In the depicted embodiment, the outer wire loops 631-1 and 632-1, for example, are high enough to make mechanical and/or electrical contact with the subsequently applied top conductive layer 160, as discussed below with reference to FIG. 6E. This eliminates the need for drilling through a portion of the mold compound 150 to access the top-edges of the outer wire loops 631-1 and 632-1, while still providing a second electromagnetic shield (e.g., outer wire fence 630) parallel to the first electromagnet shield (e.g., inner wire fence 130) to form double lateral side shields. In alternative embodiments, the outer wire fence 630 may not extend high enough to contact the subsequently applied top conductive layer 160 and/or may be about the same height as the inner wire fence 130, without departing from the scope of the present teachings.

Figure 6C:
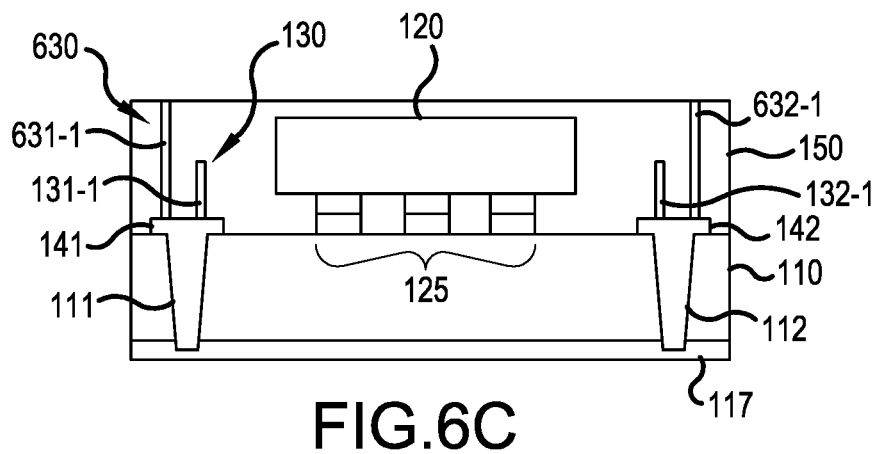

As shown in FIG. 6C a mold compound 150 is disposed over the PCB 105, the SMT component 120, the inner wire fence 130 and the outer wire fence 630. In an embodiment, disposing the mold compound 150 over the top of the PCB 105, the SMT component 120, the inner wire fence 130 and the outer wire fence 630 may include an injection molding process, a transfer molding process, or a compression molding process, for example, although other method of disposing the mold compound 150 may be used without departing from the scope of the present teachings. For example, the mold compound 150 may be formed of an epoxy resin, which is applied in a liquid or viscous state, and then allowed to set to provide the solid mold compound 150.

Figure 6D:
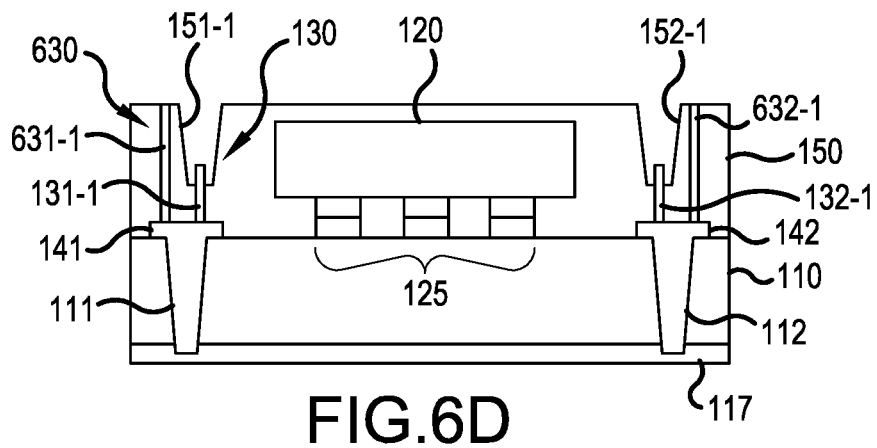

Referring to FIG. 6D, multiple holes, such as illustrative holes 151-1 and 151-2, are formed in the mold compound 150. Each hole extends partially through the mold compound 150, from a top surface of the mold compound 150 to the top-edges of the wire loops of the inner wire fence 130, as shown by the holes 151-1 and 151-2 exposing the top-edges (or apexes) of the wire loops 131-1 and 132-1 in the bottom of the holes 151-1 and 152-1, respectively. (FIG. 4 shows an example of the depth of the holes, which extend from the top surface of the mold compound 150 to dashed line 401, as discussed above.) In an embodiment, the holes are formed in the mold compound 150 by laser drilling through the mold compound 150 until the top-edge of one of the wire loops is exposed, using laser, such as a YAG laser or a helium gas laser, for example. Alternatively, mechanical drilling or other mechanical process may be incorporated, without departing from the scope of the present teachings.

In an embodiment where the outer wire fence 630 does not extend high enough to contact the subsequently applied top conductive layer 160 and/or is about the same height as the inner wire fence 130, another set of multiple holes are formed in the mold compound 150 to expose the top-edges of the outer wire loops of the outer wire fence 630. Alternatively, the holes drilled for accessing the wire loops of the inner wire fence 130 (e.g., holes 151-1 and 152-1) may be drilled with a wider circumference, such that the holes expose the top-edges of the outer wire loops, in addition to the top-edges of the inner wire loops, of the outer wire fence 630. Also, in an alternative embodiment, the order of the wire fences may be reversed, such that the taller of the wire fences, which may extend to the top conductive layer 160 (e.g., wire fence 630) is arranged as the inner wire fence, and the shorter of the wire fences, which requires conductive material 161 to extend to the top conductive layer 160 (e.g., wire fence 130) is arranged as the outer wire fence.

Figure 6E:
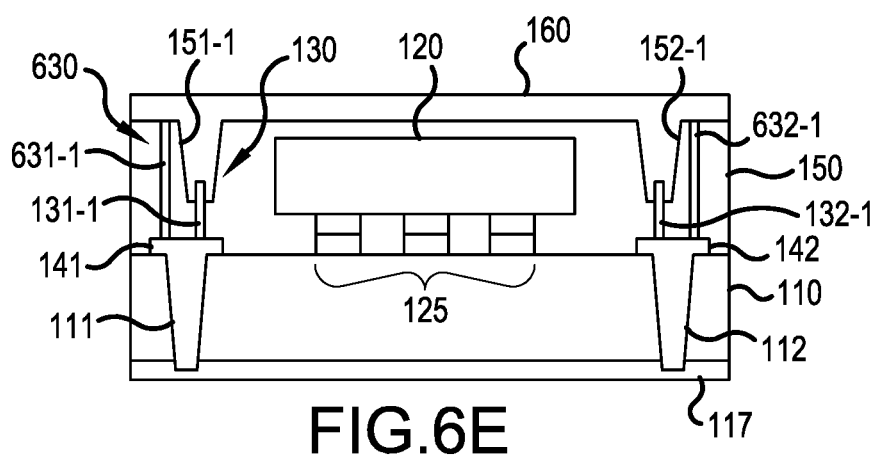

As shown in FIG. 6E, the holes in mold compound 150, including the illustrative holes 151-1 and 152-1, are filled with conductive material 161, such as copper (Cu) or silver (Ag), for example. The top conductive layer 160 is disposed over the top surface of the mold compound 150, the multiple holes (e.g., holes 151-1 and 152-1) filled with the conductive material 161, and the outer wire loops (e.g., outer wire loops 631-1 and 632-1) of the outer wire fence 630. The top conductive layer 160 may be applied using a sputtering process or a CVD process, for example, and likewise may be formed of copper (Cu) or silver (Ag), for example. In an embodiment, filling the holes with the conductive material 161 and applying the top conductive layer 160 may be performed in the same operation. The top conductive layer 160 is thus in electrical contact with the conductive material 161 filling the holes, as well as the wire loops (e.g., wire loops 131-1 and 132-1) connected with the conductive material, and in electrical contact with the outer wire loops (e.g., outer wire loops 631-1 and 632-1) of the outer wire fence 630, as discussed above.

Thus, in FIG. 6E, the inner wire fence 130 (e.g., including inner wire loops 131-1 and 132-1) and the conductive material 161 filling the multiple holes (e.g., including holes 151-1 and 152-1), the outer wire fence 630 (e.g., including outer wire loops 631-1 and 632-1), and the top conductive layer 160 provide shielding of the SMT component 120 from electromagnetic radiation. The inner wire fence 130, the conductive material 161, and the outer wire fence 630 together provide double lateral side shields. Moreover, side conductive layers 166 and 167 may be disposed over the side surfaces of the mold compound 150 and the PCB 105, as shown in FIG. 1D, for example. In this configuration, the inner wire fence 130 with the conductive material 161, the outer wire fence 630 and one of the side conductive layers 166, 167 together provide triple lateral side shields.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A module, comprising: a printed circuit board (PCB) including a substrate and a component pad and at least one wire pad on the substrate, each of the at least one wire pad being located adjacent the component pad and connected to ground by a corresponding via extending through the substrate; a surface mount technology (SMT) component mounted to the component pad; a first wire fence comprising a plurality of wire loops respectively connected to each of the at least one wire pad; a mold compound disposed over the PCB, the SMT component and the first wire fence, the mold compound defining a plurality of holes extending partially through the mold compound, from a top surface of the mold compound to top-edges of the plurality of wire loops, respectively, wherein a conductive material fills the plurality of holes; and a top conductive layer disposed over the mold compound, and in electrical contact with the conductive material filling the plurality of holes, wherein the first wire fence, the conductive material filling the plurality of holes, and the top conductive layer provide shielding of the SMT component from electromagnetic radiation, wherein the at least one wire pad comprises fewer wire pads than a number of sides of the component pad or of the SMT component, each wire pad being adjacent to a side of the component pad, such that the plurality of wire loops of the first wire fence comprises at least one wire loop connected to each of the wire pads, thereby partially surrounding the SMT component.

2. The module of claim 1, wherein the at least one wire pad comprises a single wire pad surrounding the component pad and forming an open center portion to accommodate attachment of the SMT component to the component pad, such that the plurality of wire loops of the first wire fence are connected to the single wire pad.

3. The module of claim 1, wherein that at least one wire pad comprises a plurality of wire pads surrounding the component pad, each wire pad being adjacent to a side of the component pad, such that the plurality of wire loops of the first wire fence comprise at least one wire loop connected to each of the plurality of wire pads.

4. The module of claim 1, further comprising:
    side conductive layers disposed over side surfaces of the mold compound and the PCB, each of the side conductive layers being in electrical contact with the top conductive layer and a ground layer of the PCB, wherein the side conductive layers, together with corresponding portions of the first wire fence, form double lateral side shields for further providing shielding of the SMT component from electromagnetic radiation.

5. The module of claim 4, wherein the top conductive layer and the side conductive layers further provide protection environmental stress.

6. The module of claim 1, wherein the top conductive layer is formed of the same conductive material filling the plurality of holes in the mold compound.

7. The module of claim 6, wherein the conductive material comprises copper (Cu) or silver (Ag).

8. The module of claim 1, wherein the plurality of wire loops are formed of gold (Au), silver (Ag), aluminum (Al) or copper (Cu).

9. The module of claim 8, wherein ends of each wire loop are soldered to the respective wire pad.

10. The module of claim 1, wherein the mold compound is formed of a reinforced or non-reinforced epoxy resin.

11. The module of claim 1, further comprising
a second wire fence comprising a plurality of second wire loops respectively connected to each of the at least one wire pad, top-edges of the plurality of second wire loops, respectively, being in electrical contact with the top conductive layer disposed over the top surface of the mold compound,
wherein the first and second wire fences, the conductive material filling the plurality of holes, and the top conductive layer provide shielding of the SMT component from electromagnetic radiation.

12. A module, comprising:
a printed circuit board (PCB) including a substrate, a ground layer, a plurality of component pads, and at least one wire pad associated with each of the plurality of component pads, each of the at least one wire pad associated with each of the plurality of component pads being electrically connected to the ground layer;
a plurality of surface mount technology (SMT) components mounted to the plurality of component pads, respectively;
a plurality of wire fences at least partially surrounding the plurality of SMT components, respectively, each of the wire fences comprising a corresponding plurality of wire loops connected to the at least one wire pad associated with each of the plurality of component pads;
a mold compound disposed over the PCB, the plurality of SMT components and the plurality of wire fences, the mold compound defining a plurality of holes extending partially through the mold compound, from a top surface of the mold compound to top-edges of each of the plurality of wire loops, respectively, wherein a conductive material fills the plurality of holes; and
a top conductive layer disposed over the mold compound, and in electrical contact with the conductive material filling the plurality of holes,
wherein the plurality of wire fences and the conductive material filling the plurality of holes provide lateral shielding of each of the plurality of SMT components from electromagnetic radiation.

13. The module of claim 12, wherein two wire fences of the plurality of wire fences share at least one wire pad and the corresponding plurality of wire loops connected to the at least one wire pad form each of the two wire fences.

* * * * *